(12) United States Patent
Yano et al.

(10) Patent No.: US 10,135,234 B2
(45) Date of Patent: Nov. 20, 2018

(54) PREVENTIVE APPARATUS

(71) Applicants: AutoNetworks Technologies, Ltd., Yokkaichi (JP); Sumitomo Wiring Systems, Ltd, Suzuka (JP); Sumitomo Electric Industries, Ltd., Osaka (JP)

(72) Inventors: Yusuke Yano, Mie (JP); Katsuma Tsukamoto, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 252 days.

(21) Appl. No.: 15/123,751

(22) PCT Filed: Feb. 20, 2015

(86) PCT No.: PCT/JP2015/054736
§ 371 (c)(1),
(2) Date: Sep. 6, 2016

(87) PCT Pub. No.: WO2015/133294
PCT Pub. Date: Sep. 11, 2015

(65) Prior Publication Data
US 2017/0018918 A1    Jan. 19, 2017

(30) Foreign Application Priority Data

Mar. 5, 2014 (JP) .................................. 2014-043038

(51) Int. Cl.
*H02H 3/08* (2006.01)
*H02H 3/087* (2006.01)
(Continued)

(52) U.S. Cl.
CPC ............ *H02H 3/10* (2013.01); *H02H 1/0007* (2013.01); *H02H 3/006* (2013.01); *H02H 3/085* (2013.01);
(Continued)

(58) Field of Classification Search
CPC ................................ H02H 3/08; H02H 3/087
(Continued)

(56) References Cited

U.S. PATENT DOCUMENTS 7,457,089 B2 * 11/2008 Ohshima ............... H02M 3/156
324/500
8,295,021 B2 * 10/2012 Ohshima ............... H02H 3/087
361/87

(Continued)

FOREIGN PATENT DOCUMENTS

JP    2003101129 A    4/2003
JP    3589392 B2    11/2004
(Continued)

OTHER PUBLICATIONS

JP-2007-134780; Entire drawing and specification.*
European Search Report for Application No. 15758498.8 dated Feb. 15, 2017, 6pp.

*Primary Examiner* — Dharti Patel
(74) *Attorney, Agent, or Firm* — Honigman Miller Schwartz and Cohn LLP

(57) ABSTRACT

A current flows between the drains of FETs, which function as a switch. A first constant current circuit causes a constant current to flow from the FET side of a resistor to the other side thereof. A first comparator outputs a high level voltage to the control section if the electric potential at the drain of the FET is higher than the electric potential at one end, on the first constant current circuit side, of the resistor. Furthermore, the first comparator outputs a low level voltage to the control section if the electric potential at the drain of the (Continued)

FET is lower than the electric potential at one end, on the first constant current circuit side, of the resistor. The control section turns the FETs off when the first comparator outputs the low level voltage. Furthermore, the control section changes the current that is caused to flow through the resistor by the first constant current circuit.

9 Claims, 9 Drawing Sheets

(51) Int. Cl.
*H02H 3/10* (2006.01)
*H02H 3/00* (2006.01)
*H03K 17/082* (2006.01)
*H02H 1/00* (2006.01)

(52) U.S. Cl.
CPC ......... *H02H 3/087* (2013.01); *H03K 17/0822* (2013.01)

(58) Field of Classification Search
USPC ........................................ 361/93.7
See application file for complete search history.

(56) References Cited

U.S. PATENT DOCUMENTS

| 2005/0094340 | A1* | 5/2005 | Dai ................. H02H 9/004 361/93.1 |
| 2007/0103832 | A1 | 5/2007 | Ohshima |
| 2008/0185975 | A1* | 8/2008 | Chen ................. G05F 3/16 315/291 |
| 2013/0021701 | A1 | 1/2013 | Yin et al. |
| 2013/0257443 | A1 | 10/2013 | Suzuki |

FOREIGN PATENT DOCUMENTS

| JP | 2007134780 A | 5/2007 |
| JP | 2023205173 A | 10/2013 |

* cited by examiner

PREVENTIVE APPARATUS

CROSS-REFERENCE TO RELATED APPLICATIONS

This application is the U.S. national stage of PCT/JP2015/054736 filed Feb. 20, 2015, which claims priority of Japanese Patent Application No. JP 2014-043038 filed Mar. 5, 2014.

FIELD OF THE INVENTION

The present invention relates to a preventive apparatus for preventing an overcurrent from flowing through an electric current path.

BACKGROUND

An electric power supply system for supplying electric power from an electric power supply to an electric instrument is installed in vehicles. In this electric power supply system, if, due to a short circuit, an overcurrent flows through a conductive wire that connects the electric power supply and the electric instrument, there is a risk that the conductive wire ignites. Accordingly, the electric power supply system is provided with a preventive apparatus (see JP3589392, for example) for preventing an overcurrent from flowing through the electric current path from the electric power supply to the electric instruments.

In the preventive apparatus disclosed in JP3589392, the electric power is supplied to a load from an electric power supply via FETs (Field Effect Transistors). If a current of at least a predetermined magnitude flows through an electric current path from the electric power supply to the load, the FETs interrupt the current flowing through the electric current path.

Conventional preventive apparatuses include a preventive apparatus that is provided with a switch on an electric current path from an electric power supply to a load, and compares an electric potential at one end, on the load side, of the switch with a threshold electric potential. If the switch is, for example, a semiconductor switch, and a large current flows through the electric current path, then the electric potential at the one end, on the load side, of the switch will significantly decrease due to a voltage drop caused by the on-resistance of the switch.

In the above-described preventive apparatus, if the electric potential at the one end, on the load side, of the switch is reduced to a value that is lower than the threshold electric potential, then the switch will be turned off. Accordingly, an overcurrent is prevented from flowing through the electric current path.

However, if the load is inductive, an inrush current will flow through the electric current path immediately after the load is started. In the above-described preventive apparatus, the switch is at risk of being turned off by mistake when an inrush current flows through the electric current path.

Furthermore, the temperature in the electric power supply system changes depending on the environment in which the vehicle is running, the operational state of the load, or the like. The value of the current that is allowed to flow through the switch varies according to the temperature in the region of the switch. If the temperature in the region of the switch is high, the switch may fail even if the value of the current flowing through the switch is relative small. Therefore, in the above-described preventive apparatus, if the threshold electric potential is set to a constant value, there will be a risk that an overcurrent whose value exceeds the value of the current that is allowed to flow through the switch flows through the electric current path.

Furthermore, in a case of mass production of the above-described preventive apparatuses, there is a large variation in the on-resistance values of the switches. Accordingly, assuming that the same threshold electric potential is set for all the preventive apparatuses, there is a risk that, in the preventive apparatus that is provided with a switch having a small on-resistance value, an overcurrent flows through the electric current path even if the electric potential at one end, on the load side of the switch is higher than the threshold electric potential.

The present invention was made in view of the above-described circumstances, and it is an object thereof to provide a preventive apparatus that can reliably prevent an overcurrent from flowing through an electric current path.

SUMMARY OF INVENTION

According to the present invention, a preventive apparatus that includes a switch provided on an electric current path, and that is configured to prevent an overcurrent from flowing through the electric current path by turning the switch off, includes: a resistor whose one end is connected to one end of the switch; a constant current circuit for causing a constant current to flow from the one end side of the resistor to the other end side of the resistor; changing means for changing a value of the current that is caused to flow by the constant current circuit; and a comparator for comparing an electric potential at the other end of the switch with an electric potential at the other end of the resistor, wherein the preventive apparatus is configured to turn off the switch if a result of the comparison performed by the comparator shows that the electric potential at the other end of the switch is lower than the electric potential at the other end of the resistor.

According to the present invention, an electric power supply is connected to, for example, one end of the switch, a load is connected to the other end of the switch, and a current flows through an electric current path from the electric power supply to the load. One end of the resistor is connected to the one end of the switch, and the constant current circuit causes a constant current to flow from the one end side of the resistor to the other end side. Then, the electric potential at the other end of the switch and the electric potential at the other end of the resistor are compared with each other.

When the switch is in the ON state, the electric potential at the other end of the switch has a value obtained by subtracting a voltage between both ends of the switch from an output voltage of the electric power supply, and the electric potential at the other end of the resistor has a value obtained by subtracting a voltage between both ends of the resistor from the output voltage of the electric power supply. Since the constant current is caused to flow through the resistor by the constant current circuit, the voltage between both ends of the resistor is constant. Also, when a current of at least a predetermined value flows through the electric current path, and the voltage between both ends of the switch is a predetermined voltage or more, the electric potential at the other end of the switch is lower than the electric potential at the other end of the resistor. At this time, the switch is turned off, and thus an over current is prevented from flowing through the electric current path.

Furthermore, the value of the current that is caused to flow by the constant current circuit is changed. Accordingly, the voltage between both ends of the resistor can be changed, and thus it is possible to change the threshold electric potential with which the electric potential at the other end of the switch is compared. Accordingly, when, for example, an inductive load is connected to the other end of the switch, it is possible to change the threshold electric potential to a low electric potential only during a predetermined time period immediately after the start of the load. Furthermore, it is also possible to change the threshold electric potential based on the temperature in the region of the switch, or to change the threshold electric potential for each apparatus. By appropriately setting the threshold electric potential, it is possible to reliably prevent an overcurrent from flowing through the electric current path.

According to the present invention, the preventive apparatus may further include a temperature detection section for detecting a temperature in the region of the switch, wherein the changing means is configured to change the value of the current that is caused to flow by the constant current circuit to a small or large value, based on a temperature detected by the temperature detection section.

According to the present invention, a temperature in the region of the switch is detected. If the detected temperature is high, that is, the switch is likely to fail, the value of the current that is caused to flow by the constant current circuit is changed to a small value, and the threshold electric potential with which the electric potential at the other end of the switch is compared is increased. Furthermore, if the detected temperature is low, that is, the switch is not likely to fail, the value of the current that is caused to flow by the constant current circuit is changed to a large value, and the threshold electric potential with which the electric potential at the other end of the switch is compared is decreased. Accordingly, it is possible to reliably prevent the failure of the switch, and to efficiently let a current flow through the electric current path.

According to the present invention, the preventive apparatus may be such that a load is connected to the other end of the switch, determination means for determining whether or not the load is about to operate is provided, and the changing means is configured to increase the value of the current that is caused to flow by the constant current circuit if it is determined by the determination means that the load is about to operate.

According to the present invention, the load is connected to the other end of the switch. If it is determined that the load is about to operate (about to start operation), the value of the current that is caused to flow by the constant current circuit is increased, and the threshold electric potential with which the electric potential at the other end of the switch is compared is decreased. Accordingly, the likelihood is low that the switch is turned off by mistake when an inrush current is generated immediately after the start of the load.

According to the present invention, the preventive apparatus may be such that the changing means is configured to set back the value of the current that is caused to flow by the constant current circuit to a value prior to the increase, when a predetermined time period has elapsed since it was determined by the determination means that the load is about to operate.

According to the present invention, when a predetermined time period has elapsed since it was determined that the load is about to operate and the value of the current that is caused to flow by the constant current circuit was increased, the value of the current that is caused to flow by the constant current circuit is set back to the current value prior to the increase. Accordingly, it is possible to decrease the threshold electric potential with which the electric potential at the other end of the switch is compared, only during a time period in which the load operates and an inrush current flows through the electric current path.

According to the present invention, the preventive apparatus may be such that the constant current circuit is provided with two transistors, each of the two transistors has a first terminal, a second terminal, and a third terminal, in each of the two transistors, a current having a value that corresponds to a voltage between the first terminal and the second terminal of the transistor flows between the second terminal and the third terminal of the transistor, the first terminal and the third terminal of one of the two transistors are connected to the first terminal of the other one of the two transistors, electric potentials at the second terminals of the two transistors are substantially the same, the other end of the resistor is connected to the third terminal of the other transistor, and the changing means is configured to change the value of the current that is caused to flow by the constant current circuit, by changing the value of the current flowing between the second terminal and the third terminal of the one transistor.

According to the present invention, the constant current circuit is provided with two transistors, and each of the two transistors includes a first terminal, a second terminal, and a third terminal. In each of the two transistors, the current having a value that corresponds to a voltage between the first terminal and the second terminal of the transistor flows between the second terminal and the third terminal of the transistor. The first terminal and the third terminal of one of the two transistors are connected to the first terminal of the other one of the two transistors, and electric potentials at the second terminals of the two transistors are substantially the same. Also, the other end of the resistor is connected to the third terminal of the other transistor.

In the above-described case where two transistors are connected to each other, the voltage between the first terminals and the second terminals of the two transistors are substantially equal to each other. Accordingly, if the value of the current flowing between the second terminal and the third terminal of each of the two transistors changes similarly to the voltage between the first terminal and the second terminal thereof, the current having a value obtained by multiplying the value of the current flowing between the second terminal and the third terminal of one transistor by a predetermined value will flow between the second terminal and the third terminal of the other transistor. Also, by changing the value of the current flowing between the second terminal and the third terminal of one transistor, it is easy to change the current that is caused to flow by the constant current circuit, that is, the value of the current flowing between the second terminal and the third terminal of the other transistor.

When the respective two transistors are NPN-type bipolar transistors, the first terminal is a base, the second terminal is an emitter, and the third terminal is a collector.

According to the present invention, it is possible to reliably prevent an overcurrent from flowing through an electric current path.

DETAILED DESCRIPTION OF THE PREFERRED EMBODIMENTS

Hereinafter, the present invention will be described with reference to the drawings illustrating embodiments thereof.

Embodiment 1

Figure 1:
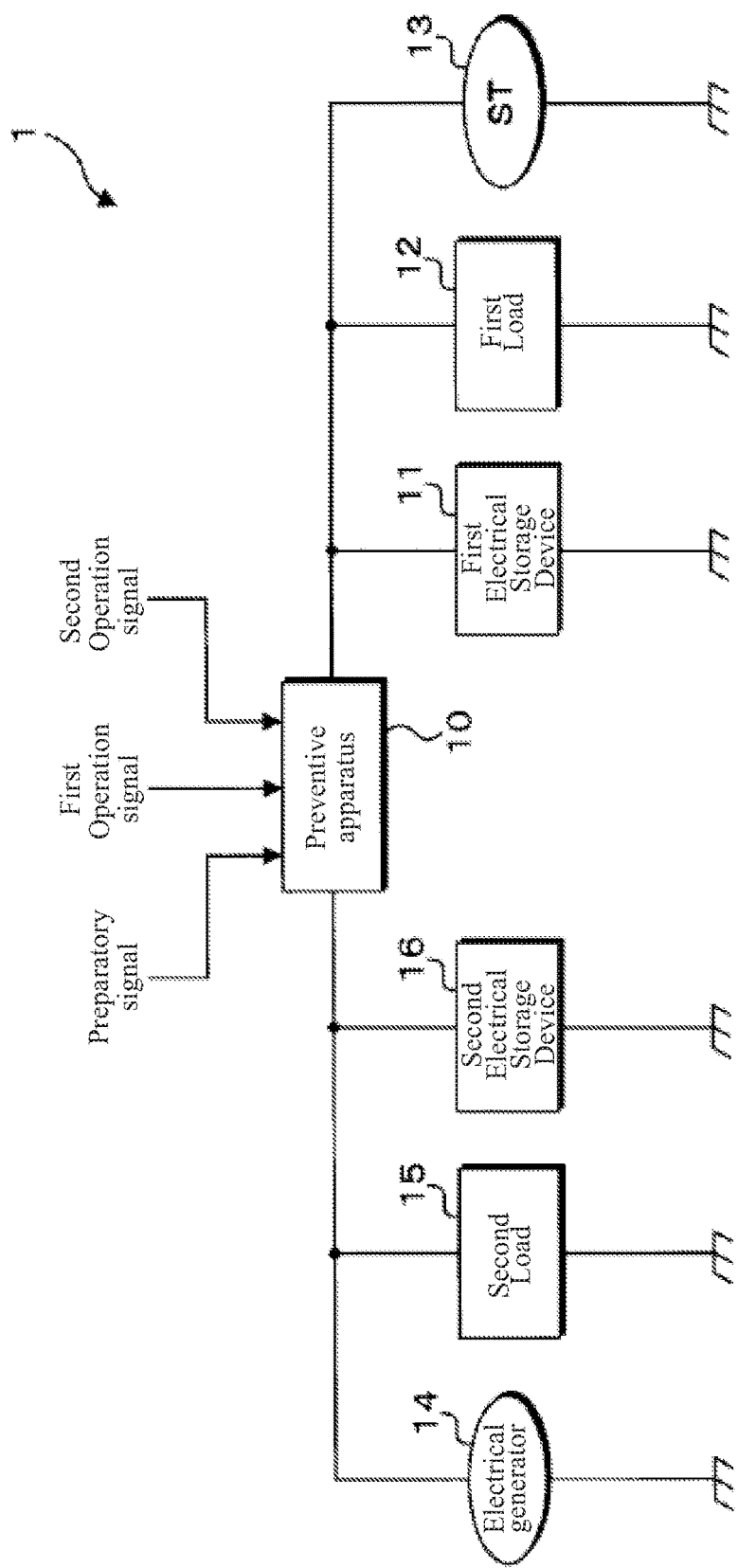
FIG. 1 is a block diagram illustrating a configuration of main components of an electric power supply system according to Embodiment 1.

FIG. 1 is a block diagram illustrating a configuration of main components of an electric power supply system according to Embodiment 1. This electric power supply system 1 is appropriately installed in a vehicle, and is provided with a preventive apparatus 10, a first electrical storage device 11, a first load 12, a starter 13, an electrical generator 14, a second load 15, and a second electrical storage device 16. One end of the preventive apparatus 10 is connected to the positive electrode of the first electrical storage device 11, one end of the first load 12, and one end of the starter 13. The other end of the preventive apparatus 10 is connected to one end of the electrical generator 14, one end of the second load 15, and the positive electrode of the second electrical storage device 16. The negative electrodes of the first electrical storage device 11 and the second electrical storage device 16, and the other ends of the first load 12, the starter 13, the electrical generator 14, and the second load 15 are grounded.

The electrical generator 14 generates alternating-current regenerative electric power when, for example, the brake pedal of the vehicle is pressed and the vehicle speed is reduced. The electrical generator 14 rectifies the generated alternating-current regenerative electric power to direct-current regenerative electric power. The electrical generator 14 supplies the rectified direct-current regenerative electric power to the first electrical storage device 11 and the first load 12 via the preventive apparatus 10, and also supplies the rectified direct-current regenerative electric power to the second load 15 and the second electrical storage device 16.

The second load 15 is an electric instrument that is installed in the vehicle, and is supplied with electric power from the first electrical storage device 11, the electrical generator 14, and the second electrical storage device 16.

The second electrical storage device 16 is an electric double layer capacitor, a lithium-ion battery, or the like, and stores the electric power supplied from the electrical generator 14. The second electrical storage device 16 is further supplied with electric power from the first electrical storage device 11 via the preventive apparatus 10, and stores the electric power supplied from the first electrical storage device 11. The second electrical storage device 16 supplies the stored electric power to the first electrical storage device 11 and the first load 12 via the preventive apparatus 10, and supplies the stored electric power to the second load 15.

The first electrical storage device 11 is, for example, a lead storage battery, and is supplied with electric power from the electrical generator 14 and the second electrical storage device 16 via the preventive apparatus 10, and stores the electric power supplied from the electrical generator 14 and the second electrical storage device 16. The first electrical storage device 11 supplies the stored electric power to the first load 12 and the starter 13, and supplies the stored electric power to the second load 15 and the second electrical storage device 16 via the preventive apparatus 10.

Similar to the second load 15, the first load 12 is an electric instrument that is installed in the vehicle, and is supplied with electric power from the first electrical storage device 11, the electrical generator 14, and the second electrical storage device 16.

The starter 13 is a motor for starting an engine that is not shown and operates using the electric power stored in the first electrical storage device 11.

A preparatory signal (advance signal) for giving advance notification that the starter 13 is about to operate, a first operation signal for giving advance notification that the first load 12 is about to operate, and a second operation signal for giving advance notification that the second load 15 is about to operate are input to the preventive apparatus 10.

If a current of at least an interruption threshold flows between two ends of the preventive apparatus 10, the preventive apparatus 10 interrupts the current flow, thereby preventing the overcurrent from flowing through an electric current path for the current flowing between the two ends of the preventive apparatus 10. The preventive apparatus 10 also interrupts the current flow upon input of the preparatory signal. Accordingly, the starter 13 is supplied with the electric power by the first electrical storage device 11. Furthermore, the preventive apparatus 10 adjusts the interruption threshold upon input of the first operation signal or the second operation signal.

Figure 2:
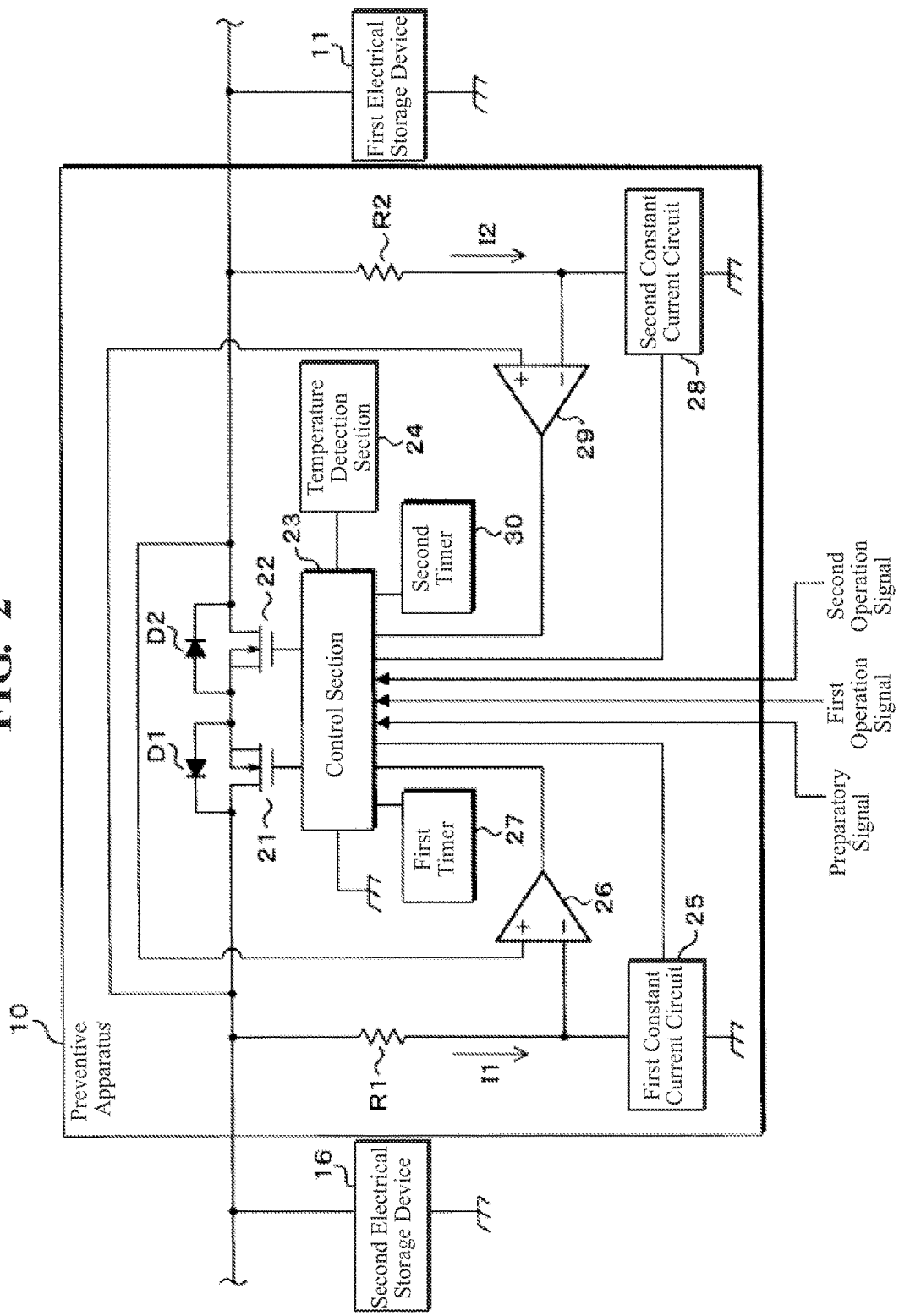
FIG. 2 is a block diagram illustrating a configuration of main components of a preventive apparatus.

FIG. 2 is a block diagram illustrating a configuration of main components of the preventive apparatus 10. The preventive apparatus 10 includes N-channel type FETs 21 and 22, a control section 23, a temperature detection section 24, a first constant current circuit 25, a first comparator 26, a first timer 27, a second constant current circuit 28, a second comparator 29, a second timer 30, diodes D1 and D2, and resistors R1 and R2. The diodes D1 and D2 are respectively parasitic diodes of the FETs 21 and 22.

The drain of the FET 21 and the cathode of the diode D1 are connected to the one end of the electrical generator 14, the one end of the second load 15, and the positive electrode of the second electrical storage device 16. The anodes of the diodes D1 and D2, and the source of the FET 22 are connected to the source of the FET 21. The cathode of the diode D2, the positive electrode of the first electrical storage device 11, the one end of the first load 12, and the one end of the starter 13 are connected to the drain of the FET 22. The gates of the FETs 21 and 22 are connected to the control section 23, and the control section 23 is further connected to the temperature detection section 24. The control section 23 is also grounded.

The first load 12 and the second load 15 function as the "load" recited in the claims.

One end of the resistor R1 is connected to the drain of the FET 21, and the other end of the resistor R1 is connected to the first constant current circuit 25 and the negative terminal of the first comparator 26. The first constant current circuit 25 is further connected to the control section 23 and is also grounded. The positive terminal of the first comparator 26 is connected to the drain of the FET 22, and the output terminal of the first comparator 26 is connected to the control section 23. Also, the first timer 27 is connected to the control section 23.

One end of the resistor R2 is connected to the drain of the FET 22, and the other end of the resistor R2 is connected to the second constant current circuit 28 and the negative terminal of the second comparator 29. The second constant current circuit 28 is further connected to the control section 23 and is also grounded. The positive terminal of the second comparator 29 is connected to the drain of the FET 21, and the output terminal of the second comparator 29 is connected to the control section 23.

The FETs 21 and 22 function as a switch. When at least a predetermined voltage is applied to the gates of the FETs 21 and 22 by the control section 23, a current can flow between the drains and the sources of the FETs 21 and 22, and the FETs 21 and 22 are turned on. Furthermore, when the voltage applied to the gates of the FETs 21 and 22 by the control section 23 is less than the predetermined voltage, no current flows between the drains and the sources of the FETs 21 and 22, and the FETs 21 and 22 are turned off. The control section 23 simultaneously turns the FETs 21 and 22 on/off by adjusting the magnitude of the voltage that is applied to the gates of the FETs 21 and 22. The "switch" recited in the claims corresponds to the two FETs 21 and 22 as a whole.

Since the source of the FET 21 is connected to the source of the FET 22, the anode of the diode D1 is connected to the anode of the diode D2. Accordingly, when both FETs 21 and 22 are in the OFF state, no current will flow through the diodes D1 and D2.

The FETs 21 and 22 are provided on the electric current path for the current flowing between both ends of the preventive apparatus 10.

The first constant current circuit 25 causes a constant current to flow from the FET 21 side of the resistor R1 to the other side thereof. A value I1 of the current that is caused to flow by the first constant current circuit 25 is changed by the control section 23. The control section 23 functions as the "changing means" recited in the claims.

Figure 3:
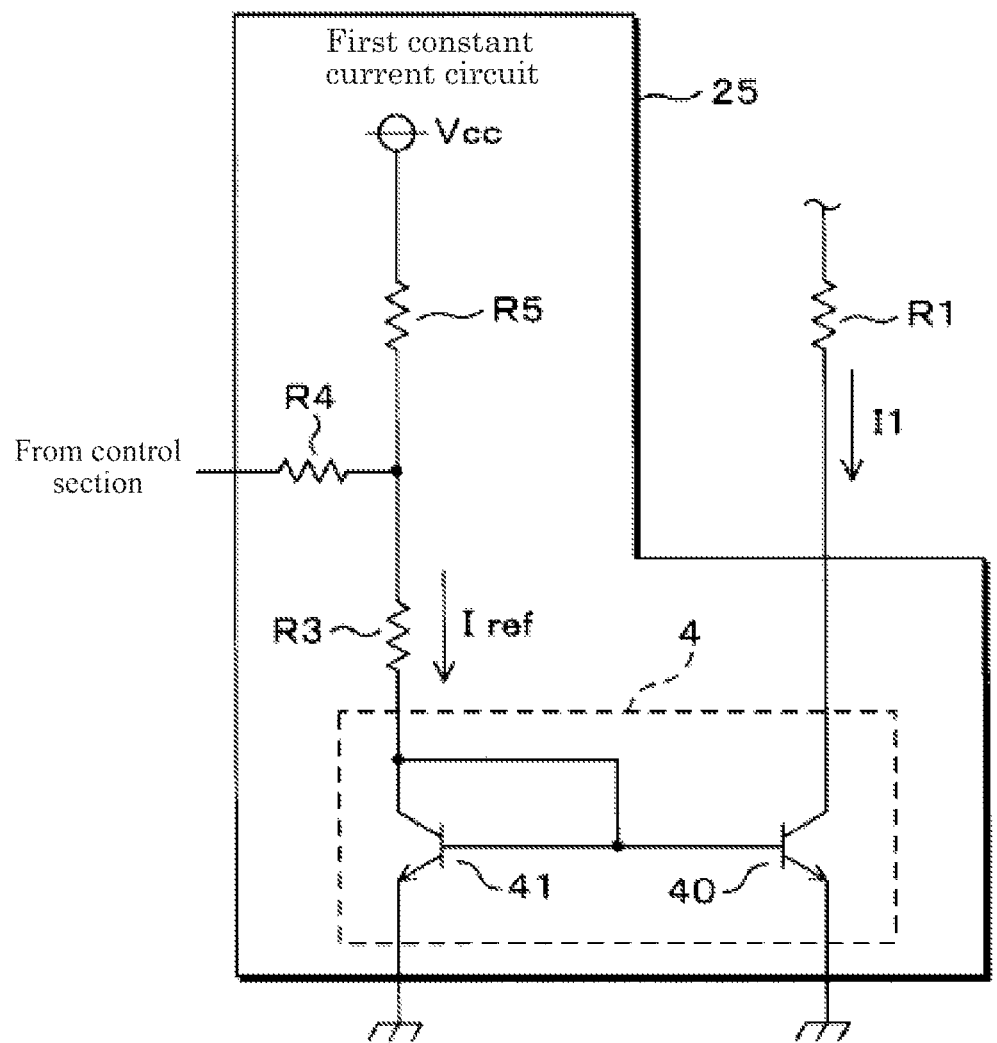
FIG. 3 is a circuit diagram of a first constant current circuit.

FIG. 3 is a circuit diagram of the first constant current circuit 25. The first constant current circuit 25 includes a current mirror circuit 4, and resistors R3, R4, and R5. The current mirror circuit 4 has two NPN-type bipolar transistors 40 and 41. Each of the bipolar transistors 40 and 41 has a base, an emitter, and a collector. The other end of the resistor R1 is connected to the collector of the bipolar transistor 40 of the current mirror circuit 4. The base of the bipolar transistor 40 is connected to the base and the collector of the bipolar transistor 41. The emitters of the bipolar transistors 40 and 41 are grounded, and the electric potentials at the emitters of the bipolar transistors 40 and 41 are substantially the same. The collector of the bipolar transistor 41 is connected to one end of the resistor R3, and the other end of the resistor R3 is connected to one end of the resistor R4 and one end of the resistor R5. The other end of the resistor R4 is connected to the control section 23, and a predetermined voltage Vcc is applied to the other end of the resistor R5.

In each of the bipolar transistors 40 and 41, a current whose value increases or decreases depending on a voltage between the base and the emitter of the corresponding bipolar transistor flows between the emitter and the collector thereof. If the same voltage is applied between the bases and the emitters of the bipolar transistors 40 and 41, a current having a value obtained by multiplying the value of the current flowing between the collector and the emitter of the bipolar transistor 41 by a predetermined value will flow between the collector and the emitter of the bipolar transistor 40.

The bipolar transistors 40 and 41 respectively function as "the one transistor" and "the other transistor" recited in the claims. The base, the emitter, and the collector of each of the bipolar transistors 40 and 41 respectively correspond to the first terminal, the second terminal, and the third terminal that are recited in the claims.

In the first constant current circuit 25, the voltage Vcc is applied between the other end of the resistor R5 and the emitter of the bipolar transistor 41. Accordingly, a current flows through the other end of the resistor R5, the resistor R3, the collector and the emitter of the bipolar transistor 41, in the stated order. Since the same voltage is applied to the bases of the bipolar transistors 40 and 41, the current having the value I1 that is obtained by multiplying a value Iref of the current flowing between the collector and the emitter of the bipolar transistor 41 by a predetermined value flows through the resistor R1.

Note that the voltage Vcc is generated by, for example, a regulator that is not shown. The regulator generates the voltage Vcc based on, for example, an output voltage of the second electrical storage device 16.

By adjusting the electric potential at the other end of the resistor R4 or opening the other end of the resistor R4, the control section 23 changes the current value Iref. Accordingly, the current value I1 is changed.

Specifically, by applying the voltage Vcc using the electric potential at the emitter of the bipolar transistor 41 as a reference to the other end of the resistor R4, or by grounding the one end of the resistor R4, the control section 23 adjusts the electric potential at the other end of the resistor R4.

Figure 4:
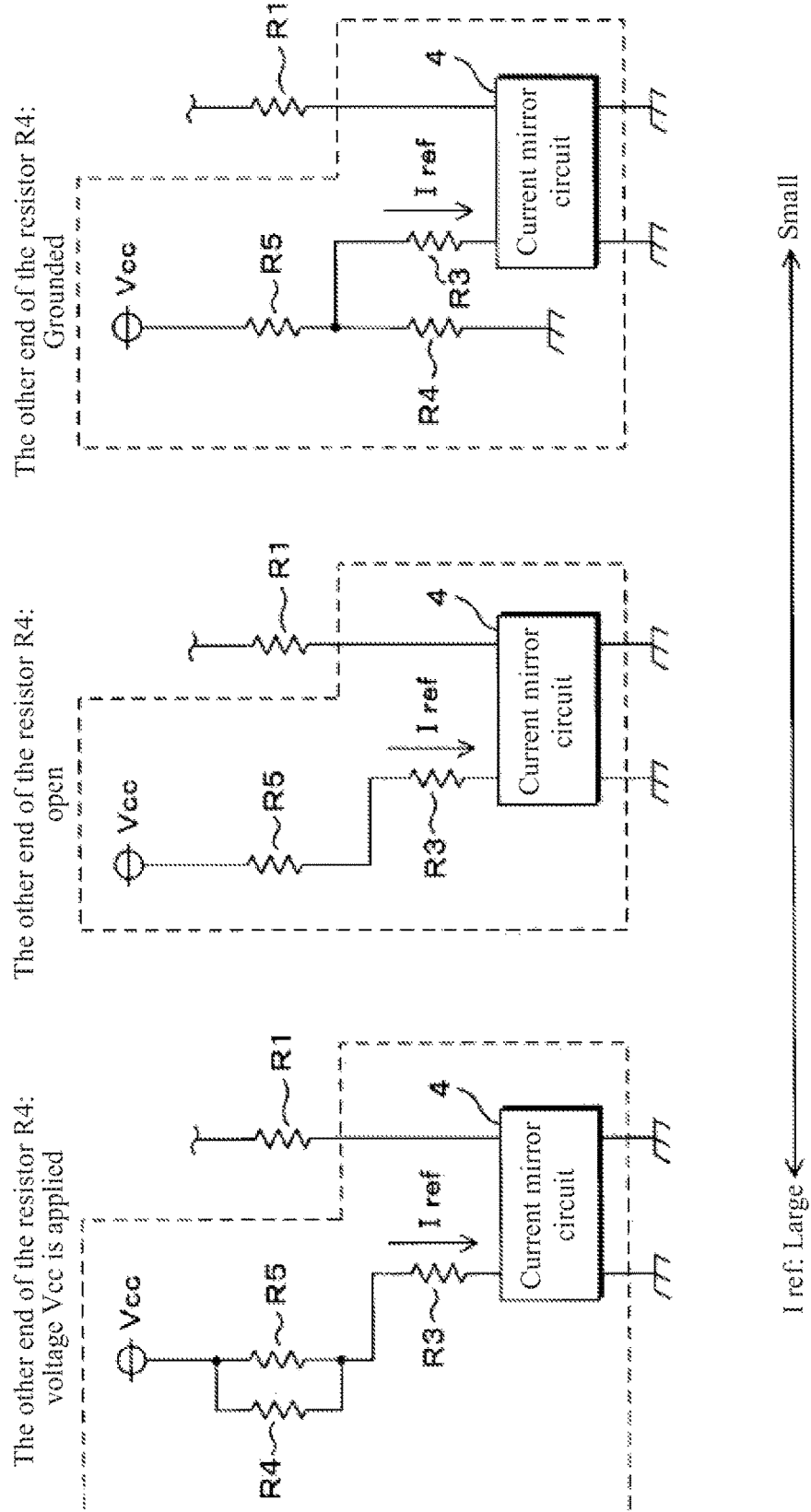
FIG. 4 shows equivalent circuit diagrams of the first constant current circuit in output states of a control section.

FIG. 4 shows equivalent circuit diagrams of the first constant current circuit 25 for various output states of the control section 23. The output state applied by the control section 23 to the other end of the resistor R4 is either a state in which the voltage Vcc is applied to one end of the resistor R4, a state in which one end of the resistor R4 is open, or a state in which one end of the resistor R4 is grounded.

FIG. 4 shows, on the left side, in the center, and on the right side, respective equivalent circuits of the first constant current circuit 25 for the case that the voltage Vcc is applied to the other end of the resistor R4, the case that the other end of the resistor R4 is open, and the case that one end of the resistor R4 is grounded. The equivalent circuits of the first constant current circuit 25 are enclosed by the dotted lines.

If the control section 23 applies the voltage Vcc to the other end of the resistor R4, the resistors R4 and R5 are connected in parallel to each other, as is clear from the equivalent circuit shown on the left side of FIG. 4. Accordingly, the resistor R3, and the resistor combination of the resistors R4 and R5 connected in parallel are connected in series to each other.

If the control section 23 has opened the other end of the resistor R4, no current flows through the resistor R4. Accordingly, the resistors R3 and R5 are connected in series to each other, as is clear from the equivalent circuit shown in the center of FIG. 4. Here, the resistance value of the resistor combination of the resistors R4 and R5 connected in parallel is smaller than the resistance value of the resistor R5. Accordingly, the current value Iref in the case where the control section 23 has opened the other end of the resistor R4 is smaller than the current value Iref in the case where the voltage Vcc is applied to the other end of the resistor R4 by the control section 23.

If the control section 23 has grounded the other end of the resistor R4, a part of the current flowing through the resistor R5 flows through the resistor R4 instead of the resistor R3, as is clear from the equivalent circuit shown on the right side of FIG. 4. Accordingly, the current value Iref in the case where the control section 23 has grounded the other end of the resistor R4 is smaller than the current value Iref in the case where the control section 23 has opened the other end of the resistor R4.

As described above, by adjusting the electric potential at the other end of the resistor R4 or opening the other end of the resistor R4, the control section 23 can easily change the value I1 of the current that flows through the resistor R1 by the first constant current circuit 25, that is, the value of the current that flows between the emitter and the collector of the bipolar transistor 40.

Note that the electric potential at the other end of the resistor R4 may be adjusted to other electric potentials in addition to the ground potential and the electric potential at the other end of the resistor R5 to which the voltage Vcc is applied. In this case, it is possible to adjust the current value Iref more finely.

As shown in FIG. 2, the first comparator 26 compares the electric potential at the drain of the FET 22 with the electric potential at the other end of the resistor R1. If the electric potential at the drain of the FET 22 is higher than the electric potential at the other end of the resistor R1, the first comparator 26 outputs, from the output terminal thereof, a high level voltage to the control section 23. Furthermore, if the electric potential at the drain of the FET 22 is lower than the electric potential at the other end of the resistor R1, the first comparator 26 outputs, from the output terminal thereof, a low level voltage to the control section 23. The first comparator 26 functions as the comparator.

A start instruction to instruct the start of time measurement, and an end instruction to instruct the end of the time measurement are input to the first timer 27 from the control section 23. Upon input of the start instruction from the control section 23, the first timer 27 starts time measurement, and a first measured time that was measured by the first timer 27 is read by the control section 23. Upon input of the end instruction from the control section 23, the first timer 27 ends the time measurement.

The configurations and effects of the second constant current circuit 28, the second comparator 29, and the second timer 30 are the same as those of the first constant current circuit 25, the first comparator 26, and the first timer 27. With respect to the configurations and effects of the second constant current circuit 28, the second comparator 29, and the second timer 30, the resistor R2, the FET 22, and the FET 21 respectively correspond to the resistor R1, the FET 21, and the FET 22 that were used in the descriptions of the first constant current circuit 25, the first comparator 26, and the first timer 27.

Accordingly, the second constant current circuit 28 causes a constant current to flow from the FET 22 side of the resistor R2 to the other side thereof, and a value I2 of the current that is caused to flow by the second constant current circuit 28 is changed by the control section 23. Furthermore, the second comparator 29 compares the electric potential at the drain of the FET 21 with the electric potential at the other end of the resistor R2. A second measured time that was measured by the second timer 30 is read from the second timer 30 by the control section 23. Similar to the first comparator 26, the second comparator 29 functions as a "comparator". The control section 23 can easily change the value I2 of the current that is caused to flow through the resistor R2 by the second constant current circuit 28.

The temperature detection section 24 is constituted by, for example, a thermistor, and is configured to detect the temperature in the region of (i.e. around) the switch (hereinafter, described as "switch temperature"). The switch temperature detected by the temperature detection section 24 is read by the control section 23.

The preparatory signal, the first operation signal, and the second operation signal are input to the control section 23. Furthermore, a high level voltage or a low level voltage is input to the control section 23 from the output terminals of the first comparator 26 and the second comparator 29.

Upon input of the preparatory signal, the control section 23 turns the FETs 21 and 22 off. Then, the starter 13 operates with the electric power of the first electrical storage device 11, and the engine starts. After a sufficient time period for starting the engine has elapsed since the FETs 21 and 22 are turned off, the control section 23 turns the FETs 21 and 22 on.

Commonly, the control section 23 puts the FETs 21 and 22 in the ON state in a time period other than the time period relating to the operation of the starter 13. During the time period in which the FETs 21 and 22 are in the ON state, a current flows between the drains of the FETs 21 and 22. Hereinafter, the value of the current flowing between the drains of the FETs 21 and 22 is denoted by "switch current value".

If the switch current value is a predetermined current value or more, the control section 23 turns the FETs 21 and 22 off, and prevents an overcurrent from flowing between both ends of the preventive apparatus 10.

The control section 23 changes, in the above-described manner, the value I1 of the current that is caused to flow through the resistor R1 by the first constant current circuit 25, based on the temperature detected by the temperature detection section 24 and the first measured time measured by the first timer 27. Similarly, the control section 23 changes the value I2 of the current that is caused to flow through the resistor R2 by the second constant current circuit 28, based on the temperature detected by the temperature detection section 24 and the second measured time measured by the second timer 30. Furthermore, the control section 23 respectively switches the FETs 21 and 22 from ON to OFF, based on the voltages that were output by the first comparator 26 and the second comparator 29.

The FETs 21 and 22, the control section 23, the temperature detection section 24, the first constant current circuit 25, the first comparator 26, and the first timer 27 prevent an overcurrent from flowing from the drain of the FET 21 to the drain of the FET 22. Also, the FETs 21 and 22, the control section 23, the temperature detection section 24, the second constant current circuit 28, the second comparator 29, and the second timer 30 prevent an overcurrent from flowing from the drain of the FET 22 to the drain of the FET 21. The control section 23 executes a first preventing process for preventing an overcurrent from flowing from the drain of the FET 21 to the drain of the FET 22, and executes a second preventing process for preventing an overcurrent from flowing from the drain of the FET 22 to the drain of the FET 21. The control section 23 executes the first preventing process and the second preventing process when the FETs 21 and 22 are in the ON state.

Figure 5:
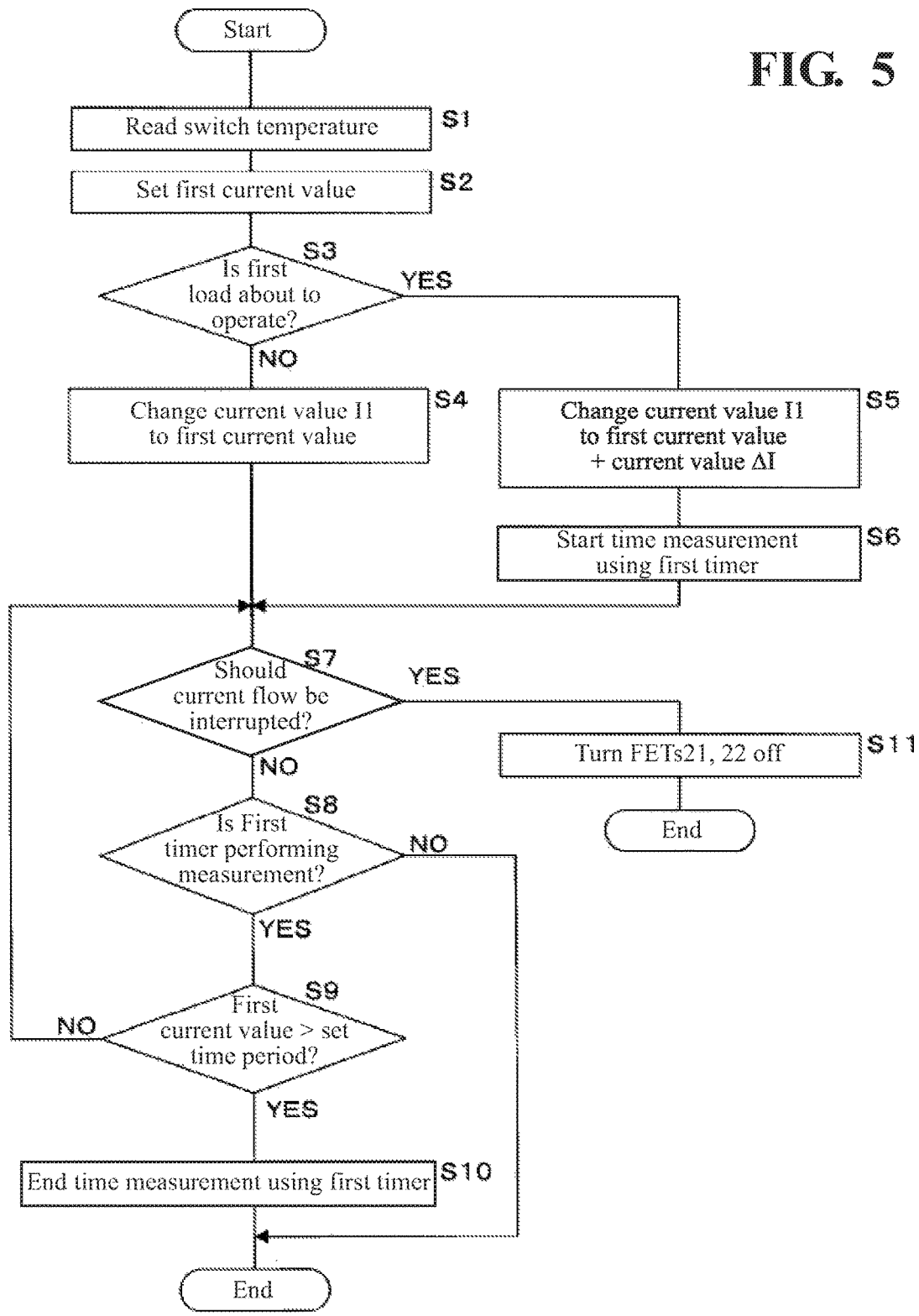
FIG. 5 is a flowchart of a first preventing process that is executed by the control section.

FIG. 5 is a flowchart of the first preventing process that is executed by the control section 23. The control section 23 first reads the switch temperature detected by the temperature detection section 24 from the temperature detection section 24 (step S1), and sets a first current value to a small or large value based on the read switch temperature (step S2). Then, based on whether or not the first operation signal has been input, the control section 23 determines whether or not the first load 12 is about to operate (step S3). If the first operation signal has been input, the control section 23 determines that the first load 12 is about to operate, and if the first operation signal has not been input, the control section 23 regards the first load 12 as being under operation or under suspension, and determines that the first load 12 is not about to operate. The control section 23 also functions as the "determination means" recited in the claims.

If it is determined that the first load 12 is not about to operate (NO in step S3), the control section 23 changes the current value I1 to the first current value set in step S2 (step S4). If it is determined that the first load 12 is about to operate (YES in step S3), the control section 23 changes the current value I1 to a value obtained by adding a predetermined current value ΔI to the first current value set in step S2 (step S5), and starts time measurement using the first timer 27 by outputting a start instruction to the first timer 27 (step S6).

As described above, if it is determined in step S3 that the first load 12 is about to operate, the control section 23 increases the current value I1 from the first current value by the current value ΔI.

Furthermore, the control section 23 sets, in step S2, the first current value to a small or large value based on the switch temperature, and changes the current value I1 to the first current value, or a current value obtained by adding the current value ΔI to the first current value. In other words, the control section 23 changes the current value I1 to a small or large value based on the switch temperature.

After having executed step S4 or step S6, the control section 23 determines, based on the voltage output by the first comparator 26, whether or not the current flow between the drains of the FETs 21 and 22 should be interrupted (step S7).

Let "Vb1" be the electric potential at the drain of the FET 21, "r1" be the resistance value of the resistor R1, "rs" be the sum of the on-resistance values of the FETs 21 and 22, and "Is" be the absolute value of the switch current value.

If a current is flowing from the drain of the FET 21 to the drain of the FET 22, the electric potential at the drain of the FET 22 is given as (Vb1−rs×Is), and the electric potential at the other end of the resistor R1, that is, at one end, on the first constant current circuit 25 side, of the resistor R1, is given as (Vb1−r1×I1).

A value obtained by subtracting the electric potential at the other end of the resistor R1 from the electric potential at the drain of the FET 22 is given as (r1×I1−rs×Is). If the absolute value Is of the switch current value is (r1×I1/rs) or less, the first comparator 26 outputs, from the output terminal thereof, a high level voltage to the control section 23. If the first comparator 26 outputs a high level voltage, the control section 23 determines in step S7 that the current flow should not be interrupted.

If the absolute value Is of the switch current value exceeds (r1×I1/rs), the first comparator 26 outputs, from the output terminal thereof, a low level voltage to the control section 23. If the first comparator 26 outputs a low level voltage, the control section 23 determines in step S7 that the current flow should be interrupted.

Let "Vb2" be the electric potential at the drain of the FET 22. If a current is flowing from the drain of the FET 22 to the drain of the FET 21, the electric potential at the other end of the resistor R1 is given as (Vb2−rs×Is−r1×I1). A value obtained by subtracting the electric potential at the other end of the resistor R1 from the electric potential Vb2 at the drain of the FET 22 is given as (rs×Is+r1×I1), and is always larger than zero.

Accordingly, if a current is flowing from the drain of the FET 22 to the drain of the FET 21, the first comparator 26 always outputs a high level voltage from the output terminal thereof, and the control section 23 determines in step S7 that the current flow should not be interrupted.

If it is determined that the current flow should not be interrupted (NO in step S7), the control section 23 determines whether or not the first timer 27 is measuring a time (step S8). If it is determined that the first timer 27 is measuring a time (YES in step S8), the control section 23 determines whether or not the first measured time measured by the first timer 27 is a preset set time period or more (step S9).

If it is determined that the first measured time is less than the set time period (NO in step S9), the control section 23 returns the procedure to step S7, and repeats the determination whether or not the current flow should be interrupted with the current value I1 changed to the current value obtained by adding the current value ΔI to the first current value, until the first measured time is the set time period or more.

If it is determined that the first measured time is the set time period or more (YES in step S9), the control section 23 ends the time measurement using the first timer 27 by outputting the end display to the first timer 27 (step S10). If it is determined that the first timer 27 does not measure a time (NO in step S8) or after the execution of step S10, the control section 23 ends the first preventing process.

The control section 23 repeats the first preventing process while the FETs 21 and 22 are in the ON state. When the set time period has elapsed since it was determined in step S3 that the first load 12 is about to operate, and then the control section 23 has started the first preventing process, the first load 12 is under operation, and thus the control section 23 changes the current value I1 to the current value prior to the increase in step S5, that is, the first current value, as long as the switch temperature does not change.

If it is determined that the current flow should be interrupted (YES in step S7), that is, if the result of the comparison performed by the first comparator 26 shows that the electric potential at the drain of the FET 22 is lower than the electric potential at the other end of the resistor R1, the control section 23 turns the FETs 21 and 22 off (step S11). Then, the control section 23 ends the first preventing process.

The second preventing process for preventing an overcurrent from flowing from the drain of the FET 22 to the drain of the FET 21 is similar to the first preventing process. In the description of the second preventing process, the second load 15, the second constant current circuit 28, the second comparator 29, the second timer 30, a second current value, the current value I2, the second operation signal, and the second measured time respectively correspond to the first load 12, the first constant current circuit 25, the first comparator 26, the first timer 27, the first current value, the current value I1, the first operation signal, and the first measured time of the first preventing process. The second current value of the second preventing process is a current value that is set in the step corresponding to step S2 of the first preventing process, and is set to a small or large value based on the switch temperature read from the temperature detection section 24, similarly to the first current value.

Let "r2" be the resistance value of the resistor R2. If a current is flowing from the drain of the FET 22 to the drain of the FET 21, the electric potential at the drain of the FET 21 is given as (Vb2−rs×Is), and the electric potential at the other end of the resistor R2, that is at one end, on the second constant current circuit 28 side, of the resistor R2 is given as (Vb2−r2×I2).

A value obtained by subtracting the electric potential at the other end of the resistor R2 from the electric potential at the drain of the FET 22 is given as (r2×I2−rs×Is). If the absolute value Is of the switch current value is (r2×I2/rs) or less, the second comparator 29 outputs, from the output terminal thereof, a high level voltage to the control section 23, and in the second preventing process, the control section 23 determines that the current flow should not be interrupted. Also, if the absolute value Is of the switch current exceeds (r2×I2/rs), the second comparator 29 outputs a low level voltage from the output terminal thereof, and in the second preventing process, the control section 23 determines that the current flow should be interrupted.

If a current is flowing from the drain of the FET 21 to the drain of the FET 22, the electric potential at the other end of the resistor R2 is given as (Vb1−rs×Is−r2×I2). Since the electric potential at the drain of the FET 21 is Vb1, the value obtained by subtracting the electric potential at the other end of the resistor R2 from the electric potential at the drain of the FET 21 is given as (rs×Is+r2×I2), and is always larger than zero.

Accordingly, if a current is flowing from the drain of the FET 21 to the drain of the FET 22, the second comparator 29 always outputs a high level voltage from the output terminal thereof, and in the second preventing process, the control section 23 determines that the current flow should not be interrupted.

The control section 23 repeats the first preventing process and the second preventing process until both FETs 21 and 22 are turned off in the first preventing process or the second preventing process. At this time, the control section 23 may be configured to alternately execute the first preventing process and the second preventing process, or to execute the first preventing process and the second preventing process in parallel.

The preventive apparatus 10 having the above-described configuration can change, by changing the current value I1, the threshold electric potential with which the first comparator 26 compares the electric potential at the drain of the FET 22, that is, the electric potential at the other end of the resistor R1. Furthermore, the preventive apparatus 10 can change, by changing the current value I2, the threshold electric potential with which the second comparator 29 compares the electric potential at the drain of the FET 21, that is, the electric potential at the other end of the resistor R2. By appropriately setting the above-described two threshold electric potentials, it is possible to reliably prevent an overcurrent from flowing through the electric current path.

Furthermore, in the case of mass production of the preventive apparatuses 10, there is a variation in the on-resistance values of the FETs 21 and 22. However, by performing fine adjustment in the current values I1 and I2, specifically, the first current value and the second current value, the preventive apparatus 10 turns the produced FETs 21 and 22 off at an appropriate timing, and interrupts the current flow.

Figure 6:
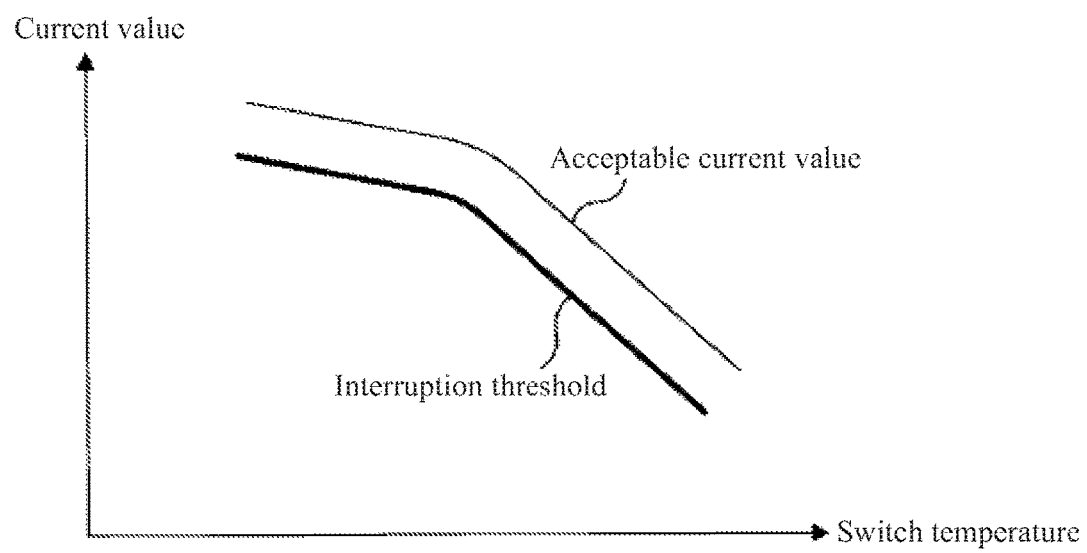
FIG. 6 is a diagram explaining an effect of the preventive apparatus.

FIG. 6 is a diagram illustrating an effect of the preventive apparatus 10. FIG. 6 shows a graph in a fine line that illustrates the relationship between the acceptable current value, which is the absolute value of an acceptable switch current value, and the switch temperature. Furthermore, FIG. 6 shows a graph in a heavy line that illustrates the relationship between the interruption threshold, which is the absolute value of the switch current value at which a current flow is to be interrupted, and the switch temperature.

As shown in the fine line of FIG. 6, the acceptable current value decreases with an increase in the switch temperature. This is because, at a high switch temperature, the structures of, for example, the FETs 21 and 22 change even if the switch current value Is is relatively small, and the FETs 21 and 22 may lose their function as a switch.

In the first preventing process and the second preventing process, since the first current value and the second current value are set to a small or large value based on the switch temperature as described above, the current values I1 and I2 decrease with an increase in the switch temperature. Accordingly, the interruption thresholds, which are given as (r1×I1/rs) in the first process and as (r2×I2/rs) in the second process, decrease with an increase in the switch temperature. Accordingly, as shown by the heavy line of FIG. 6, it is possible to set the interruption threshold for every switch temperature to the value that is less than the acceptable current value. Therefore, it is possible to reliably prevent failures of the FETs 21 and 22, and to efficiently let a current flow between the drains of the FETs 21 and 22.

Figure 7:
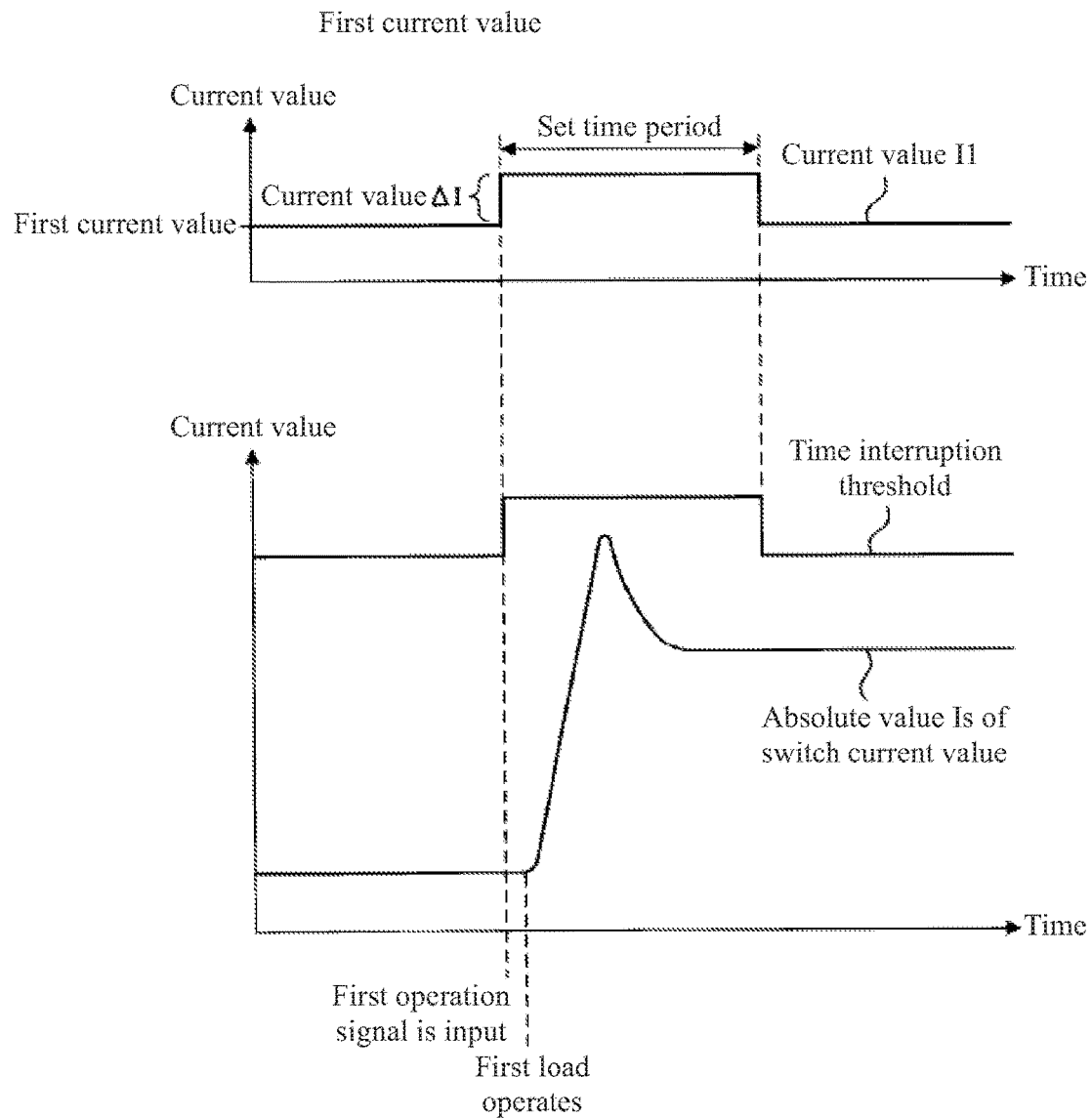
FIG. 7 is a diagram explaining another effect of the preventive apparatus.

FIG. 7 is a diagram illustrating another effect of the preventive apparatus 10. FIG. 7 shows an example of change, over time, of the current value IL the absolute value Is of the switch current value, and the interruption threshold. Here, it is assumed that the switch temperature is constant. As described above, in the first preventing process, upon input of the first operation signal to the control section 23, the control section 23 changes the current value I1 to a value obtained by adding the current value ΔI to the first current value. Accordingly, the threshold electric potential with which the electric potential at the drain of the FET 22 is compared, that is, the electric potential at the other end of the resistor R1 decreases, and the interruption threshold, which is given as (r1×I1/rs), increases. Accordingly, the likelihood is low that the FETs 21 and 22 are turned off by mistake when the first load 12 operating from the halted state causes an inrush current to flow via the FETs 21 and 22, and the absolute value Is of the switch current value temporarily becomes a high value.

As described above, after a design time has elapsed since the first operation signal was input to the control section 23 and it was determined by the control section 23 that the first load 12 is about to operate, the current value I1 is set back to the first current value. Accordingly, the interruption threshold is set back to the value at which the current value I1 is the first current value. Accordingly, it is possible to decrease the threshold electric potential with which the electric potential at the drain of the FET 22 is compared and to increase the interruption threshold, only during the time period in which an inrush current flows between the drains of the FETs 21 and 22.

Note that the set time period is preferably a time period that is longer than a time period from a point in time when the first operation signal is input to the control section 23, generating an inrush current, to a point in time when the absolute value Is of the switch current value is stabilized.

Although the effects that are obtained by the control section 23 executing the first preventing process have been described so far with reference to FIG. 7, the same effects can be obtained also in the case where the control section 23 executes the second preventing process. That is, by the control section 23 increasing the current value I2 to the value obtained by adding the current value ΔI to the second current value when the second load 15 is about to operate, the likelihood of the FETs 21 and 22 being turned off by mistake when an inrush current flows is reduced. Furthermore, since the current value I2 is set back to the second current value after a set time period has elapsed since the current value I2 was increased, it is possible to increase the threshold electric potential with which the electric potential at the drain of the FET 21 is compared only during a time period in which an inrush current flows, thereby increasing the interruption threshold.

Embodiment 2

Figure 8:
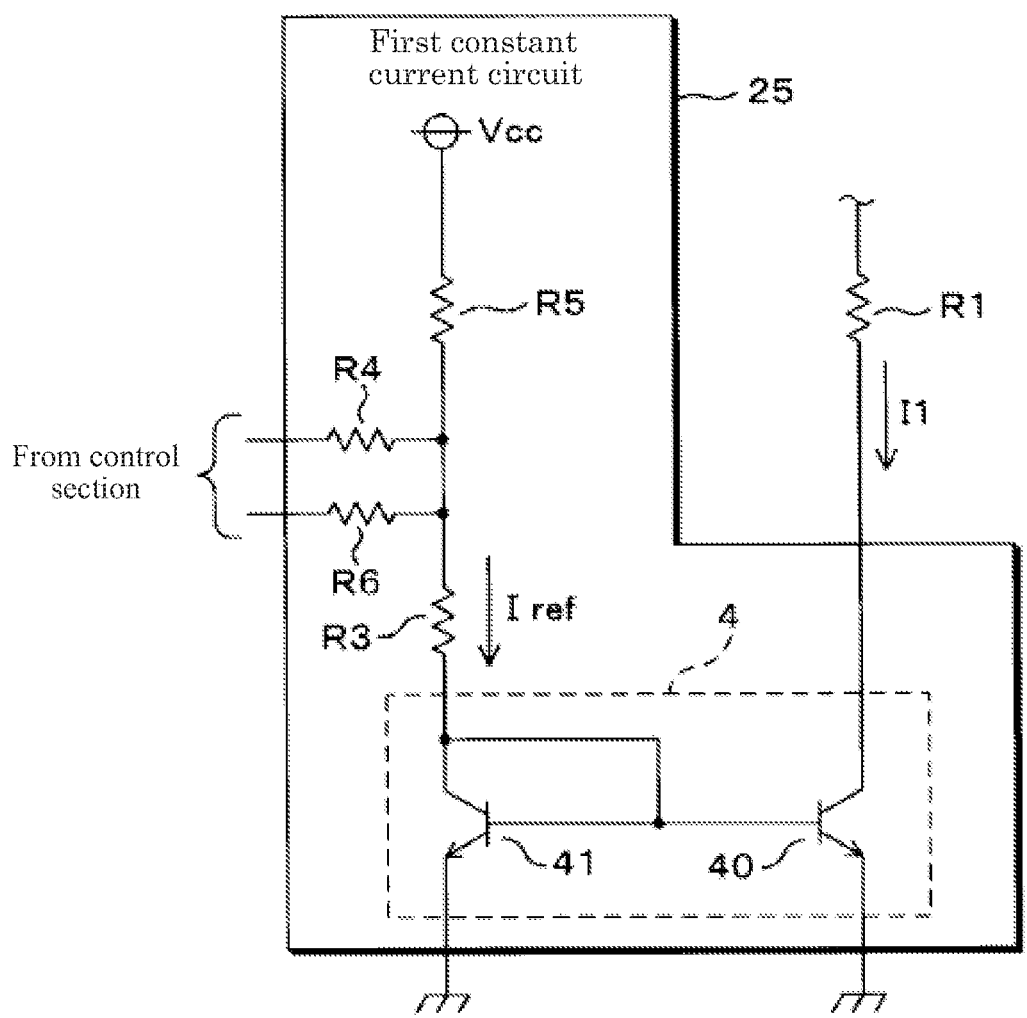
FIG. 8 is a circuit diagram of a first constant current circuit according to Embodiment 2.

FIG. 8 is a circuit diagram of a first constant current circuit 25 according to Embodiment 2. Embodiment 2 differs from Embodiment 1 in the circuit configurations of the first constant current circuit 25 and a second constant current circuit 28.

The following will describe the differences of Embodiment 2 from Embodiment 1. Structures other than those that will be described later are the same as those of Embodiment 1, and like reference numerals are given to like components and redundant descriptions are omitted.

The first constant current circuit 25 of Embodiment 2 includes a current mirror circuit 4 and resistors R3, R4, and R5, which are connected to each other in the same manner as those of Embodiment 1. The first constant current circuit 25 of Embodiment 2 further includes a resistor R6 that has one end that is connected to one end of the resistor R5, and another end that is connected to the control section 23.

The control section 23 performs the same operation on the other end of the resistor R6 as that performed on the other end of the resistor R4. That is, the control section 23 adjusts the electric potential at the other end of the resistor R6, or opens the other end of the resistor R6.

Assuming that the state at the other end of the resistor R4 is fixed, the current value Iref is the largest when the voltage Vcc is applied to the other end of the resistor R6, as described with reference to FIG. 4. Also, the current value Iref is second largest when the other end of the resistor R6 is open, and the current value Iref is the smallest when the other end of the resistor R6 is grounded.

By adding the resistor R6 as described above, it is possible for the control section 23 to control the current value Iref more finely. When the resistance values of the resistors R4 and R6 are different, there are nine values for the current value Iref, and the control section 23 can change the current value I1 to any of the nine values.

Furthermore, the respective electric potentials at the other ends of the resistors R4 and R6 may be added to the electric potential at the other end of the resistor R5 to which the voltage Vcc is applied and to the ground electric potential, so as to be adjusted to other electric potentials. In this case, it is possible to adjust the current value Iref more finely.

Since the second constant current circuit 28 of Embodiment 2 is configured similarly to the first constant current circuit 25 of Embodiment 2, the control section 23 can control the current value I2 more finely.

Similar to Embodiment 1, since the control section 23 of Embodiment 2 performs the first preventing process and the second preventing process, and only the configurations for changing the current values I1 and I2 are different from those of Embodiment 1, the preventive apparatus 10 of Embodiment 2 has the same effect as that of Embodiment 1.

Note that, in Embodiment 2, the number of the resistors for adjusting the current value Iref is not limited to two, and may be three or more. In this case, the third resistors onward are connected similarly to the resistor R4 or the resistor R6, and the control section 23 performs the same operation as that performed on the other end of the resistor R4.

Embodiment 3

Figure 9:
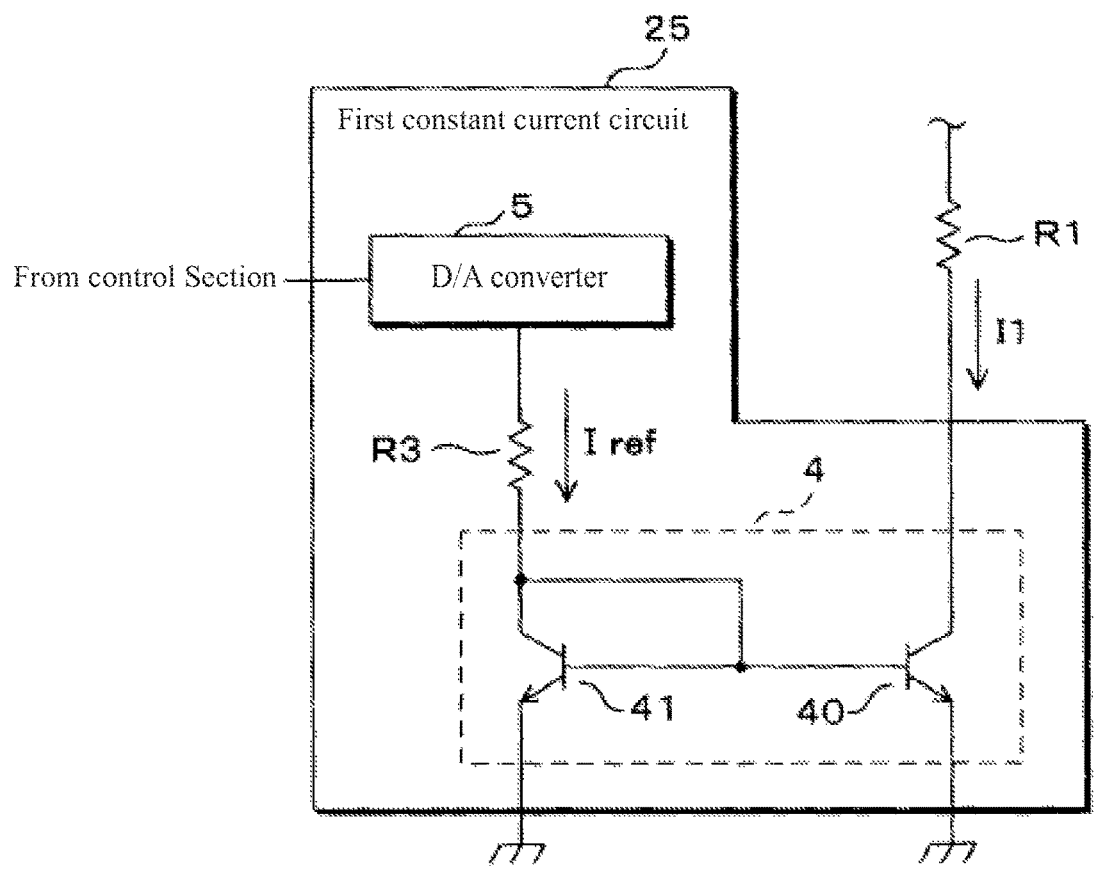
FIG. 9 is a circuit diagram of a first constant current circuit according to Embodiment 3.

FIG. 9 is a circuit diagram of a first constant current circuit 25 according to Embodiment 3. Embodiment 3 differs from Embodiment 1 in the circuit configurations of the first constant current circuit 25 and a second constant current circuit 28.

The following will describe the differences of Embodiment 3 from Embodiment 1. Structures other than those that will be described later are the same as those of Embodiment 1, and like reference numerals are given to like components and redundant descriptions are omitted.

The first constant current circuit 25 of Embodiment 3 includes a current mirror circuit 4 and a resistor R3, which are connected to each other in the same manner as in Embodiment 1. The first constant current circuit 25 of Embodiment 3 further includes a D/A converter 5. The D/A converter 5 is connected to the other end of the resistor R3, and the control section 23.

Note that the one end of the resistor R3 is connected to the collector and the base of the bipolar transistor 41.

A digital signal showing the magnitude of a voltage to be applied between the other end of the resistor R3 and the emitter of the bipolar transistor 41 is input to the D/A converter 5 from the control section 23. The D/A converter 5 applies the voltage having the magnitude shown by the digital signal input from the control section 23 between the other end of the resistor R3 and the emitter of the bipolar transistor 41. Accordingly, an electric current flows through the other end of the resistor R3, and the collector and the emitter of the bipolar transistor 41, in the stated order.

Assuming that the voltage that is applied by the D/A converter 5 between the other end of the resistor R3 and the emitter of the bipolar transistor 41 is "Vda", the current value Iref is calculated by the following formula:

$$Iref = (Vda - Vbe)/r3 \qquad (1)$$

where "r3" is a resistance value of the resistor R3, and "Vbe" is a voltage between the base and the emitter of the bipolar transistor 41. As given by Formula (1), the current value Iref increases or decreases depending on the voltage Vda.

The control section 23 adjusts the magnitude of the voltage Vda by outputting digital signals showing the various magnitudes of the voltage to the D/A converter 5. Accordingly, the control section 23 changes the current value Iref, and changes the current value I1.

In the first constant current circuit 25 having the above-described configuration, the control section 25 can change the current value I1 with a simple configuration.

Since the second constant current circuit 28 of Embodiment 3 is configured similarly to the first constant current circuit 25 of Embodiment 3, the control section 23 can change the current value I2 with a simple configuration.

Similar to Embodiment 1, since the control section 23 of Embodiment 3 performs the first preventing process and the second preventing process, and only the configurations for changing the current values I1 and I2 are different from those of Embodiment 1, the preventive apparatus 10 of Embodiment 3 has the same effects as those of Embodiment 1.

Note that, in Embodiments 1 to 3, the timing at which the current value I1 (or the current value I2) increased from the first current value (or the second current value) is set back to the first current value (or the second current value) when the first load 12 (or the second load 15) is about to operate, is not limited to the timing after a set time period has elapsed since the current value I1 (or the current value I2) was increased. For example, it is also possible that the absolute value Is of the switch current value is monitored, and the current value I1 (or the current value I2) is set back to the first current value (or the second current value) when the absolute value Is of the switch current value is stabilized.

Furthermore, it is also possible to perform, when the first load 12 (or the second load 15) is about to operate, either the process for changing the current value I1 (or the current value I2) or the process for changing the current value I1 (or the current value I2) based on the switch temperature, instead of both thereof. Furthermore, the condition for changing the current value I1 (or the current value I2) is not limited to the case where the first load 12 (or the second load 15) is about to operate or the case where the switch temperature is changed, and may be, for example, a case where a change instruction to change the current value I1 (or the current value I2) has been received from a user.

Furthermore, with respect to the FETs 21 and 22, the drain of the FET 21 may be connected to the drain of the FET 22, and the source of the FET 21 may be connected to one end of the resistor R1 and to the positive terminal of the second comparator 29, and the source of the FET 22 may be connected to one end of the resistor R2 and the positive terminal of the first comparator 26. When the FETs 21 and 22 are connected as described above, the cathodes of the diodes D1 and D2 are respectively connected to the sources of the FETs 21 and 22, and the anodes of the diodes D1 and D2 are respectively connected to the drains of the FETs 21 and 22. Since the cathode of the diode D1 is connected to the cathode of the diode D2, no current flows through the diodes D1 and D2 when both FETs 21 and 22 are in the OFF state.

Furthermore, since the FETs 21 and 22 need only to function as a switch, the respective FETs 21 and 22 may be P-channel type FETs or bipolar transistors. Furthermore, instead of the FETs 21 and 22, a single semiconductor switch may be used. This semiconductor switch is preferably a switch through which no current will flow between both ends thereof if it is in the OFF state. Furthermore, the first constant current circuit 25 and the second constant current circuit 28 are not limited to configurations using a bipolar transistor, and may be configurations using a FET. For example, two N-channel type FETs are used for the bipolar transistors 40 and 41, the gate, source, and drain of each of the two FETs corresponds to the base, emitter, and collector of each of the bipolar transistors 40 and 41. Furthermore, the first constant current circuit 25 and the second constant current circuit 28 may have different configurations.

The disclosed Embodiments 1 to 3 are to be construed as not limiting but exemplary in all respects. The scope of the present invention is defined not by the description above but the claims, and is intended to encompass all modifications in the sense and the scope equivalent to the claims.

The invention claimed is:

1. A preventive apparatus that includes a switch provided on an electric current path, and that is configured to prevent an overcurrent from flowing through the electric current path by turning the switch off, the preventive apparatus comprising:
   a resistor whose one end is connected to one end of the switch;
   a constant current circuit for causing a constant current to flow from the one end side of the resistor to the other end side of the resistor;
   changing means for changing a value of the current that is caused to flow by the constant current circuit; and
   a comparator for comparing an electric potential at the other end of the switch with an electric potential at the other end of the resistor,
   wherein the preventive apparatus is configured to turn off the switch if a result of the comparison performed by the comparator shows that the electric potential at the other end of the switch is lower than the electric potential at the other end of the resistor.

2. The preventive apparatus according to claim 1, further comprising:
   a temperature detection section for detecting a temperature in a region of the switch,
   wherein the changing means is configured to change the value of the current that is caused to flow by the constant current circuit to a small or large value, based on a temperature detected by the temperature detection section.

3. The preventive apparatus according to claim 2, wherein a load is connected to the other end of the switch, determination means for determining whether or not the load is about to operate is provided, and
   the changing means is configured to increase the value of the current that is caused to flow by the constant current circuit if it is determined by the determination means that the load is about to operate.

4. The preventive apparatus according to claim 2,
   wherein the constant current circuit is provided with two transistors,
   each of the two transistors has a first terminal, a second terminal, and a third terminal,
   in each of the two transistors, a current having a value that corresponds to a voltage between the first terminal and the second terminal of the transistor flows between the second terminal and the third terminal of the transistor,
   the first terminal and the third terminal of one of the two transistors are connected to the first terminal of the other one of the two transistors,
   electric potentials at the second terminals of the two transistors are substantially the same,
   the other end of the resistor is connected to the third terminal of the other transistor, and
   the changing means is configured to change the value of the current that is caused to flow by the constant current circuit, by changing the value of the current flowing between the second terminal and the third terminal of the one transistor.

5. The preventive apparatus according to claim 1,
   wherein a load is connected to the other end of the switch, determination means for determining whether or not the load is about to operate is provided, and
   the changing means is configured to increase the value of the current that is caused to flow by the constant current circuit if it is determined by the determination means that the load is about to operate.

6. The preventive apparatus according to claim 5,
   wherein the changing means is configured to set back the value of the current that is caused to flow by the constant current circuit to a value prior to the increase, when a predetermined time period has elapsed since it was determined by the determination means that the load is about to operate.

7. The preventive apparatus according to claim 6, wherein the constant current circuit is provided with two transistors, each of the two transistors has a first terminal, a second terminal, and a third terminal, in each of the two transistors, a current having a value that corresponds to a voltage between the first terminal and the second terminal of the transistor flows between the second terminal and the third terminal of the transistor, the first terminal and the third terminal of one of the two transistors are connected to the first terminal of the other one of the two transistors, electric potentials at the second terminals of the two transistors are substantially the same, the other end of the resistor is connected to the third terminal of the other transistor, and the changing means is configured to change the value of the current that is caused to flow by the constant current circuit, by changing the value of the current flowing between the second terminal and the third terminal of the one transistor.

8. The preventive apparatus according to claim 5, wherein the constant current circuit is provided with two transistors, each of the two transistors has a first terminal, a second terminal, and a third terminal, in each of the two transistors, a current having a value that corresponds to a voltage between the first terminal and the second terminal of the transistor flows between the second terminal and the third terminal of the transistor, the first terminal and the third terminal of one of the two transistors are connected to the first terminal of the other one of the two transistors, electric potentials at the second terminals of the two transistors are substantially the same, the other end of the resistor is connected to the third terminal of the other transistor, and the changing means is configured to change the value of the current that is caused to flow by the constant current circuit, by changing the value of the current flowing between the second terminal and the third terminal of the one transistor.

9. The preventive apparatus according to claim 1, wherein the constant current circuit is provided with two transistors, each of the two transistors has a first terminal, a second terminal, and a third terminal, in each of the two transistors, a current having a value that corresponds to a voltage between the first terminal and the second terminal of the transistor flows between the second terminal and the third terminal of the transistor, the first terminal and the third terminal of one of the two transistors are connected to the first terminal of the other one of the two transistors, electric potentials at the second terminals of the two transistors are substantially the same, the other end of the resistor is connected to the third terminal of the other transistor, and the changing means is configured to change the value of the current that is caused to flow by the constant current circuit, by changing the value of the current flowing between the second terminal and the third terminal of the one transistor.

\* \* \* \* \*